(12) United States Patent
Fan

(10) Patent No.: US 8,822,258 B2
(45) Date of Patent: Sep. 2, 2014

(54) WAFER LEVEL BONDING METHOD FOR FABRICATING WAFER LEVEL CAMERA LENSES

(71) Applicant: OmniVision Technologies (Shanghai) Co., Ltd., Shanghai (CN)

(72) Inventor: Regis Fan, Shanghai (CN)

(73) Assignee: OmniVision Technologies (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/865,814

(22) Filed: Apr. 18, 2013

(65) Prior Publication Data

US 2014/0087491 A1    Mar. 27, 2014

(30) Foreign Application Priority Data

Sep. 27, 2012  (CN) .......................... 2012 1 0367894

(51) Int. Cl.
| | |
|---|---|
| *H01L 21/00* | (2006.01) |
| *H01L 27/146* | (2006.01) |
| *G02B 13/00* | (2006.01) |
| *H01L 21/66* | (2006.01) |
| *G02B 3/00* | (2006.01) |

(52) U.S. Cl.
CPC .......... *H01L 22/12* (2013.01); *H01L 27/14618* (2013.01); *G02B 13/0085* (2013.01); *H01L 22/20* (2013.01); *G02B 3/0043* (2013.01); *H01L 27/14687* (2013.01); *H01L 27/14632* (2013.01)
USPC ............... 438/65; 438/68; 257/432; 257/433; 257/434; 257/291; 257/E31.128; 257/E21.499; 359/626; 250/208.1; 348/294; 427/162

(58) Field of Classification Search
CPC ........... H01L 27/14625; H04N 5/2254; G02B 3/0043
USPC .......... 257/432–434, 291, E31.128, E21.499; 438/65, 68; 359/626; 250/208.1; 348/294; 427/162
See application file for complete search history.

(56) References Cited

U.S. PATENT DOCUMENTS

| | | | | |
|---|---|---|---|---|
| 5,463,216 | A | * | 10/1995 | Van Berkel ................. 250/208.1 |
| 5,844,289 | A | * | 12/1998 | Teranishi et al. .............. 257/432 |
| 6,040,591 | A | * | 3/2000 | Otsuka .......................... 257/232 |
| 6,836,612 | B2 | * | 12/2004 | Morris et al. .................. 385/147 |
| 6,909,554 | B2 | * | 6/2005 | Liu et al. ........................ 359/626 |
| 7,009,772 | B2 | * | 3/2006 | Hsiao et al. .................... 359/619 |
| 7,112,864 | B2 | * | 9/2006 | Tsukamoto et al. .......... 257/433 |
| 7,388,714 | B2 | * | 6/2008 | Liang et al. .................... 359/637 |

(Continued)

*Primary Examiner* — Marvin Payen
*Assistant Examiner* — Victor Barzykin
(74) *Attorney, Agent, or Firm* — Blakely Sokoloff Taylor & Zafman

(57) ABSTRACT

A wafer-level bonding method for fabricating wafer level camera lenses is disclosed. The method includes: providing a lens wafer including lenses arranged in an array and a sensor wafer including sensors arranged in an array; measuring and analyzing an FFL of each lens to obtain a corresponding FFL compensation value for each lens; forming a thin transparent film (TTF) on each sensor of the sensor wafer, and the thickness of TTF is determined by the FFL compensation value of the corresponding lens; aligning and bonding the lens wafer with the sensor wafer having TTFs formed thereon. Since the focal length of each lens is adjusted to compensate the FFL of the lens by adding a TTF of transparent optical material with an index of refraction that is similar to the index of refraction of the sensor cover glass, the FFL variation of each camera lens can be reduced.

8 Claims, 2 Drawing Sheets

(56) References Cited

U.S. PATENT DOCUMENTS

| | | | | |
|---|---|---|---|---|
| 7,589,899 | B2* | 9/2009 | Kawada | 359/625 |
| 8,090,250 | B2* | 1/2012 | Lusinchi | 396/89 |
| 2005/0052751 | A1* | 3/2005 | Liu et al. | 359/626 |
| 2005/0077458 | A1* | 4/2005 | Ma et al. | 250/239 |
| 2008/0290435 | A1* | 11/2008 | Oliver et al. | 257/432 |
| 2009/0159200 | A1* | 6/2009 | Rossi et al. | 156/292 |
| 2009/0294639 | A1* | 12/2009 | Lee et al. | 250/234 |
| 2009/0309177 | A1* | 12/2009 | Jeung et al. | 257/432 |
| 2011/0039048 | A1* | 2/2011 | Rossi et al. | 428/43 |
| 2011/0273600 | A1* | 11/2011 | Kriman et al. | 348/294 |
| 2011/0304930 | A1* | 12/2011 | Welch et al. | 359/796 |
| 2011/0316108 | A1* | 12/2011 | Nihei | 257/435 |
| 2012/0218455 | A1* | 8/2012 | Imai et al. | 348/340 |
| 2013/0088637 | A1* | 4/2013 | Duparre | 348/360 |
| 2013/0242182 | A1* | 9/2013 | Rudmann et al. | 348/374 |

\* cited by examiner

WAFER LEVEL BONDING METHOD FOR FABRICATING WAFER LEVEL CAMERA LENSES

CROSS-REFERENCES TO RELATED APPLICATIONS

This application claims the priority of Chinese patent application number 201210367894.9, filed on Sep. 27, 2012, the entire contents of which are incorporated herein by reference.

TECHNICAL FIELD

The present invention relates to the field of semiconductor manufacturing, and more particularly, to a wafer-level bonding process for fabricating wafer level camera lenses, in which process, a flange focal length (FFL) compensation method is employed.

BACKGROUND

Camera is a kind of video input device. The role of a lens in a camera is equivalent to that of human eyes, and the brightness and clearness of the images taken by the camera are dependent on the quality of the lens used. One type of lens manufacturing uses full wafers to manufacture lenses in parallel using wafer processing equipment and forms lens wafers. Since a wafer camera is comprised of one or more bonded lens wafers, the result is that the wafer camera is a 2D array of lenses. Typically the array of lenses is singulated, and then individually aligned and bonded to individual sensors to make the final camera. The singulated camera lens is typically bonded to the sensor using a die-level pick and place process using either active or passive alignment techniques.

As an example of a passive camera alignment technique, a wafer level camera can be formed according to the following steps: first, a sensor wafer and a lens wafer are singulated into individual sensor dies and individual lenses, respectively; then, a flange focal length (FFL) of each individual lens is measured; after that, the individual lens chips are picked and bonded to the sensor dies one by one according to the measured FFL. This method can prevent the camera lenses from being out of focus due to the variations in their FFLs, thus meeting the performance specifications of the products. Moreover, the camera lenses fabricated by using this method can also meet the requirements on accuracies in x-y-z directions. However, since this method needs to pick the lenses, focus each of them, and then bond the focused lenses to the sensor dies one by one, such a die-level pick and place process is extremely expensive.

An alternative method for focusing is to use an active focus method where the image from the camera is analyzed, and the best focus is found using a feedback from the image on the sensor. But this method is also very expensive.

To solve the above-mentioned problems, manufacturers have proposed a wafer-level bonding process to fabricate camera lenses where the lens and sensor wafers are bonded before singulation. Specifically, as shown in FIG. 1, first, a lens wafer and a sensor wafer are provided. The lens wafer includes lenses 10 arranged in an array. The sensor wafer includes sensors 20 arranged in an array, and each of the sensor 20 has a glass cover formed thereon (not shown in FIG. 1). Then, the lens wafer and the sensor wafer are aligned and bonded to form a bonded wafer. Finally, the bonded wafer is singulated to form individual camera lenses 30. This wafer-level bonding process is mainly used in the fabrication of low-end camera lenses with relatively loose FFL 40 tolerance, such as some low-end VGA (Video Graphics Array) products, so as to improve the productivity, where FFL refers to the distance from the flange reference plane to the focal point of a lens.

However, because of fabrication errors, every lens produced may have a variation in the FFL compared with that of the ideal lens. As shown in FIG. 1, reference number 40 indicates the ideal FFL. When light transfers along the optical path, the difference in FFL of an individual lens 10 may cause the lens to have a worse performance than others. In the case when a tight design tolerance is required, the variations in FFL will cause many camera lenses to be out of focus and fail to meet the performance specifications. Therefore, accurate focusing is very important for the production of high-end camera lenses, which are required to meet higher requirements of performance. However, problems still exist during the production of high-end camera lenses using the above-mentioned existing wafer-level bonding process. Manufacturers are still seeking for solutions to solve these problems.

SUMMARY OF THE INVENTION

An objective of the present invention is to provide an improvement to the lens wafer to sensor wafer bonding process for fabricating wafer level camera lenses. In this invention, an FFL compensation method is employed, so as to compensate the FFL of each camera lens.

To achieve the above objective, the present invention provides a wafer-level bonding method for fabricating wafer level camera lenses, which includes:

step 1: providing a sensor wafer and a lens wafer, the lens wafer including lenses arranged in an array, the sensor wafer including sensors arranged in an array, each sensor including a cover glass;

step 2: measuring and analyzing an FFL of each lens of the lens wafer to obtain a corresponding FFL compensation value for each lens;

step 3: forming a thin transparent film on each sensor of the sensor wafer, and the thickness of the thin transparent film is determined according to the FFL compensation value of the corresponding lens; and step 4: aligning and bonding the lens wafer with the sensor wafer having thin transparent films formed thereon.

According to a preferred embodiment, the thin transparent film is made of an optical polymer.

According to a preferred embodiment, the optical polymer has a refractive index similar with that of the cover glass.

According to a preferred embodiment, in step 3, each thin transparent film is formed by a Step-and-Repeat molding method.

According to a preferred embodiment, the Step-and-Repeat molding method includes repeating a step of polymer dispensing.

According to a preferred embodiment, a Step-and-Repeat tool is used to perform the steps of polymer dispensing.

According to a preferred embodiment, a volume of the polymer dispensed in each step is determined by controlling parameters of the Step-and-Repeat tool, and the thickness of the thin transparent film is controlled by a mold.

According to a preferred embodiment, in step 3, thin transparent films of corresponding thicknesses are fabricated independently according to the FFL compensation value of each lens, and thereafter each thin transparent film is picked and attached to the corresponding sensor.

According to a preferred embodiment, the method further includes singulating the bonded lens wafer and sensor wafer into individual camera lenses after step 4.

It can be seen from the above technical scheme that, a thin transparent film of a certain thickness is added into the light transmission path of each lens according to an FFL compensation value of the lens, so that the thickness of the corresponding lens is appropriately increased and the FFL of the lens is compensated, in this way, the FFL variations among the lenses fabricated can be effectively reduced so as to satisfy a tighter design tolerance. Compared with the wafer-level bonding process of the prior art, the method of the present invention is applicable to all kinds of image sensor products fabricated by wafer-level sensor bonding. Compared with the die-level pick and place process of the prior art, the present invention is able to improve the productivity and lower the fabrication cost by eliminating the process of picking, focusing and bonding the individual lenses one by one. Moreover, compared with the active alignment techniques, the method of the present invention can save the cost of active focusing and achieve a higher productivity.

Moreover, since the Step-and-Repeat molding method for forming the thin transparent films can achieve a very high accuracy in the z direction without requiring a high accuracy in the x-y directions, the present invention can achieve a much lower cost.

BRIEF DESCRIPTION OF THE DRAWINGS

The present invention will be further described and specified by using figures and implementation details as follows.

DETAILED DESCRIPTION

Embodiments of the present invention will be described and specified by using specific examples and figures in follows, and those skilled in the art can easily understand other advantages and beneficial effects of this invention from contents of this specification. The present invention can also be implemented or applied in other specific examples, and details of this specification based on other views and applications can be made to various modifications and variations without departing from the spirit or scope of the invention.

Figure 1:
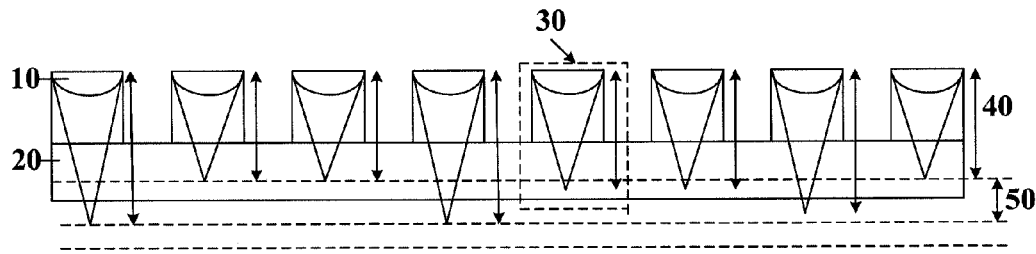
FIG. 1 is a schematic view illustrating the FFL variations among camera lenses fabricated by using an existing wafer-level bonding process
Figure 2:
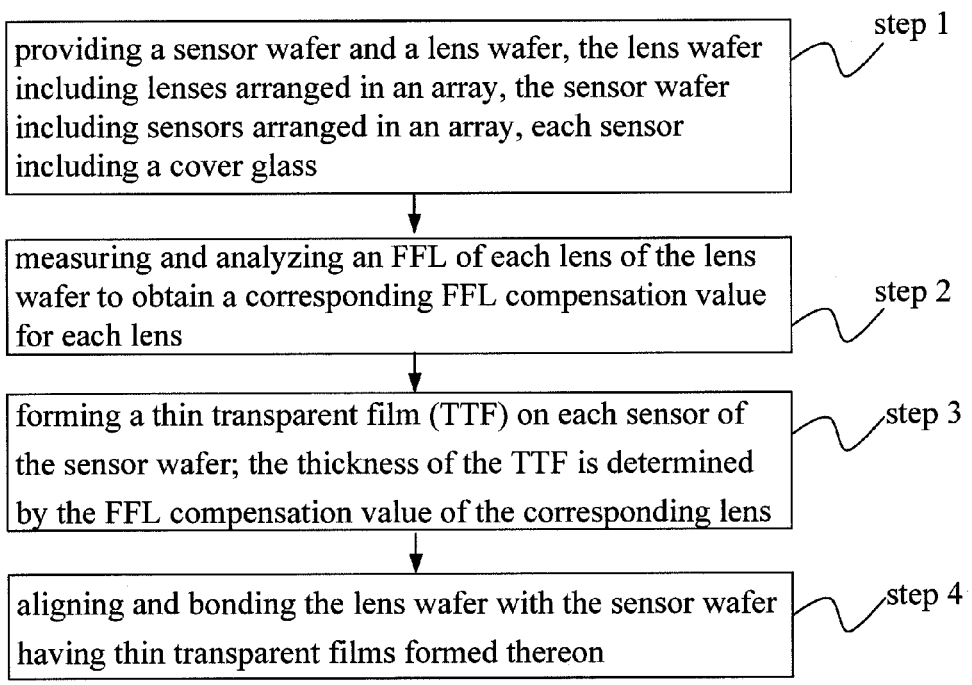
FIG. 2 is a flow chart illustrating the wafer-level bonding method for fabricating wafer level camera lenses according to an embodiment of the present invention.
Figure 3A:
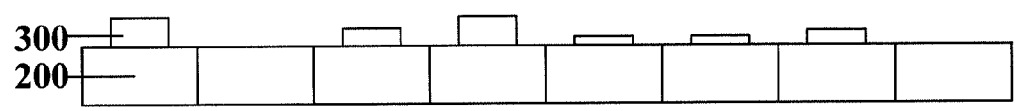
FIGS. 3A to 3B are cross-sectional schematic diagrams illustrating the wafer-level bonding method for fabricating wafer level camera lenses according to an embodiment of the present invention.
Figure 3B:
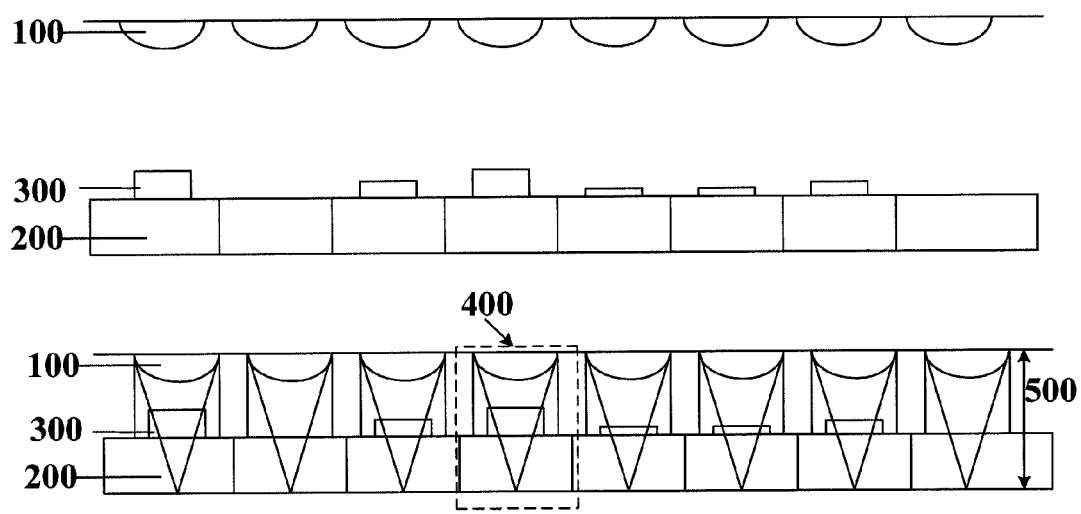

Detailed analysis on the wafer-level bonding method for fabricating wafer level camera lenses of the present invention will be made below by taking the flow chart shown in FIG. 2 as an example while giving reference to FIG. 3A and FIG. 3B. The method includes the following steps:

Step 1: a lens wafer and a sensor wafer are respectively produced by using existing fabrication processes. The lens wafer includes lenses 100 arranged in an array and the sensor wafer also includes sensors 200 arranged in an array, wherein each sensor 200 has a cover glass (not shown). The number of the lenses 100 is equal to that of the sensors 200, and each sensor 200 of the sensor wafer is corresponded with a lens 100 of the lens wafer in position.

Step 2: Since the index of refraction of forming a thin transparent film in the next process is known, the thickness of the thin transparent film can be calculated for each lens on the wafer. And an FFL of each lens 100 of the lens wafer is measured to obtain the actual value of FFL for each lens 100 of the lens wafer. The result is that the corresponding FFL compensator value can be calculated for each lens on the wafer.

Step 3: a thin transparent film 300 (TTF) is formed on each sensor 200 of the sensor wafer. The shape of each thin transparent film 300 is a thin, flat window and the thickness of each thin transparent film 300 is determined by using the FFL compensation value of the corresponding lens as obtained in step 2, and each thin transparent film 300 is formed by a Step-and-Repeat molding method. If the FFL of certain lens 100 is not needed to be compensated, then the thickness of the thin transparent film formed on the corresponding sensor 200 will be zero, or in other words, no thin transparent film will be fabricated on the corresponding sensor, see the second and the last sensors as shown in FIG. 3A. The Step-and-Repeat molding method is carried out by repeating a step of polymer dispensing and is specified as follows: first, the volume of the polymer to be dispensed in each step is determined by parameters of a Step-and-Repeat tool, and then the correct volume of the polymer is dispensed by adjusting parameters of the Step-and-Repeat tool; next, the liquid polymer is made flat using a mold in the Step-and-Repeat tool, and cured to make the thin transparent film of each corresponding FFL compensator value for each lens on the wafer. After that, the Step-and-Repeat tool is used to repeatedly perform the steps of polymer dispensing according to the determined thicknesses to form thin transparent films 300, as shown in FIG. 3A.

Alternatively, thin transparent films 300 of the corresponding thicknesses (which may be zero) can also be fabricated independently according to the FFL compensation value of each lens, and thereafter, each thin transparent film 300 is picked up by vacuum or other pickup tool, and is attached to the corresponding sensor of the sensor wafer, respectively.

Above described is nothing but preferred ways to form the thin transparent films of the present invention, and shall not limit the scope of the invention in any way. Any other method that compensates the FFL by adding a certain material onto the lens wafer according to the FFL compensation value of each lens of the lens wafer shall also fall into the scope of the present invention.

Step 4: the lens wafer is aligned with the sensor wafer, and then each lens of the lens wafer is bonded to the corresponding sensor of the sensor wafer, so as to form camera lenses 400 arranged in an array. As shown in FIG. 3B, each camera lens 400 includes a sensor 200, a thin transparent film 300 formed on the sensor 200 and a lens 100 over the thin transparent film 300, wherein each sensor 200 includes a cover glass (not shown in FIG. 3B). To minimize the refraction between the thin transparent films 300 and the cover glass of the sensor 200 so as to minimize the optical path difference generated during the light transmission through different media, the thin transparent film 300 is preferably fabricated by using an optical polymer having a refractive index that is similar with that of the cover glass. Since thickness of the cover glass of each sensor 200 is compensated by the thin transparent film 300 formed on the sensor 200, the FFL 500 of the corresponding camera lens 400 is compensated. The alignment and bonding process is commonly used in conventional wafer-level bonding processes, and thus will not be specified herein.

After step 4, the bonded lens wafer and sensor wafer are singulated into individual camera lenses 400 by cutting along the boundaries between rows and columns of the array.

According to the above description, a thin transparent film of a certain thickness is added into the light transmission path of each lens according to an FFL compensation value of each lens, so that the cover glass thickness of the corresponding lens is appropriately increased to compensate the FFL of each lens. In this way, the FFL variations among the lenses fabricated can be effectively reduced so as to satisfy a tighter design tolerance than if no compensation is used. Compared with the wafer-level bonding process of the prior art, the method of the present invention is applicable to all kinds of image sensor products fabricated by wafer-level sensor bonding. Compared with the die-level pick and place process of the prior art, the present invention is able to improve the productivity and lower the fabrication cost by eliminating the process of picking, focusing and bonding the individual lenses one by one. Moreover, compared with the active alignment techniques, the method of the present invention can save the cost of active focusing and achieve a higher productivity.

In addition, the thin transparent films are made of a special optical polymer to minimize the reflections caused by the thin transparent films, thus ensuring a good performance of the camera lenses produced. Moreover, since the Step-and-Repeat molding method for forming the thin transparent films can achieve a very high accuracy in the z direction without requiring a high accuracy in the x-y directions, the present invention can achieve a much lower cost.

What is claimed is:

1. A wafer-level bonding method for fabricating wafer level camera lenses comprising:
   step 1: providing a sensor wafer and a lens wafer, the lens wafer including lenses arranged in an array, the lens array including more than two lenses, the sensor wafer including sensors arranged in an array, the sensor array including more than two sensors, each sensor including a cover glass;
   step 2: measuring and analyzing an FFL of each lens of the lens wafer to obtain a corresponding FFL compensation value for each lens;
   step 3: forming a thin transparent film on each sensor of the sensor wafer, a thickness of the thin transparent film being determined according to the FFL compensation value of the corresponding lens; and
   step 4: aligning and bonding the lens wafer with the sensor wafer having thin transparent films formed thereon;
   wherein in said step 3, each thin transparent film is formed on each sensor of the sensor wafer by a Step-and-Repeat molding method; and
   wherein said thin transparent film is formed on a sensor of the sensor wafer only if the FFL compensation value of the corresponding lens is not zero.

2. The method according to claim 1, wherein the thin transparent film is made of an optical polymer.

3. The method according to claim 2, wherein the optical polymer has a refractive index similar with that of the cover glass.

4. The method according to claim 1, wherein the Step-and-Repeat molding method comprises repeating a step of polymer dispensing.

5. The method according to claim 4, wherein a Step-and-Repeat tool is used to perform the steps of polymer dispensing.

6. The method according to claim 5, wherein a volume of the polymer dispensed in each step is determined by controlling parameters of the Step-and-Repeat tool, and the thickness of the thin transparent film is controlled by a mold.

7. A wafer-level bonding method for fabricating wafer level camera lenses comprising:
   step 1: providing a sensor wafer and a lens wafer, the lens wafer including lenses arranged in an array, the lens array including more than two lenses, the sensor wafer including sensors arranged in an array, the sensor array including more than two sensors, each sensor including a cover glass and being corresponded with a lens of the lens wafer;
   step 2: measuring and analyzing an FFL of each lens of the lens wafer to obtain a corresponding FFL compensation value for each lens;
   step 3: forming a thin transparent film on each sensor of the sensor wafer, a thickness of the thin transparent film being determined according to the FFL compensation value of the corresponding lens; and
   step 4: aligning and bonding the lens wafer with the sensor wafer having thin transparent films formed thereon;
   wherein in said step 3, thin transparent films of corresponding thicknesses are fabricated independently according to the FFL compensation value of each lens, and thereafter each thin transparent film is formed on each sensor of the sensor wafer and is picked and attached to the corresponding sensor; and
   wherein said thin transparent film is formed on a sensor of the sensor wafer only if the FFL compensation value of the corresponding lens is not zero.

8. The method according to claim 1, further comprising singulating the bonded lens wafer and sensor wafer into individual camera lenses after said step 4.

* * * * *